United States Patent [19]

Chu et al.

[11] Patent Number: 5,508,653
[45] Date of Patent: Apr. 16, 1996

[54] MULTI-VOLTAGE CIRCUIT ARRANGEMENT AND METHOD FOR ACCOMMODATING HYBRID ELECTRONIC SYSTEM REQUIREMENTS

[75] Inventors: Edwin Chu, Cupertino; Terng-Huei Lai, Milpitas, both of Calif.

[73] Assignee: ACC Microelectronics Corporation, Santa Clara, Calif.

[21] Appl. No.: 320,438

[22] Filed: Oct. 7, 1994

Related U.S. Application Data

[63] Continuation-in-part of Ser. No. 129,990, Sep. 29, 1993.
[51] Int. Cl.$^6$ .......................... H03K 19/0175; G05F 1/00
[52] U.S. Cl. ................... 327/519; 326/80; 326/63
[58] Field of Search .................... 326/80, 81, 63; 327/519, 547

[56] References Cited

U.S. PATENT DOCUMENTS

| 4,929,852 | 5/1990 | Bae | 326/81 |
|---|---|---|---|
| 5,352,942 | 10/1994 | Tanaka | 326/63 |
| 5,406,140 | 4/1995 | Wert | 326/81 |

FOREIGN PATENT DOCUMENTS

| 2248988 | 4/1992 | United Kingdom | 326/80 |
|---|---|---|---|

OTHER PUBLICATIONS

Applications Note from S–MOS Systems, "Low Power Low Voltage Gate Array," Nov. 13, 1992.

*Primary Examiner*—William L. Sikes
*Assistant Examiner*—Tiep H. Nguyen
*Attorney, Agent, or Firm*—Schneck & McHugh

[57] ABSTRACT

A multi-voltage circuit on a semiconductor chip including core circuitry driven by a power supply voltage equal to the voltage of a selected external device operating in connection with the semiconductor chip, and having input/output circuitry in selected regions for operating in connection with external devices having the same operating voltage and other external devices having a selected substantially lower operating voltage. Peripheral input/output circuit regions of at least first and second kinds are established for interfacing with the respective high and low voltage external devices. According to one version of the invention, the input/output circuitry directed toward interfacing with external devices operating at a particular voltage level is concentrated at a particular peripheral region in the periphery of the semiconductor chip. According to another version of the invention, multiple regions of input/output circuitry are established for external devices at the same voltage level. These multiple regions may be configured by the system designer to operate with any combination of high voltage and low voltage external devices.

14 Claims, 3 Drawing Sheets

5,508,653

MULTI-VOLTAGE CIRCUIT ARRANGEMENT AND METHOD FOR ACCOMMODATING HYBRID ELECTRONIC SYSTEM REQUIREMENTS

CROSS REFERENCE TO RELATED APPLICATION

This application is a continuation in part of application Ser. No. 08/129,990, filed Sep. 29, 1993.

TECHNICAL FIELD

The field of this invention is that of multi-voltage circuit arrangements and methods, and more particularly multi-voltage circuit arrangements and methods for accommodating hybrid system requirements.

BACKGROUND OF THE INVENTION

Semiconductor technology is increasingly being driven by market demand for low-power, portable computer systems. Such computer systems include a range of new products directed toward laptop, palmtop and pen-based computers. The effects of this market influence include a strong tendency to increasingly rely upon lower voltage integrated circuits (IC's) and application specific integrated circuits (ASIC's). These low voltage devices help to extend the battery life of the particular systems in which they are used. However, this extended battery life is obtained at the cost of system performance. For example, the delay through a semiconductor device is dependent upon a number of parameters, including the supply voltage. As the supply voltage decreases, the overall speed of the device diminishes. Another concern when using low voltage devices is the reality that existing components such as expansion cards, disk drives and other external devices are built using components that operate at the higher voltage levels. Thus, low voltage devices must include additional circuitry known as level shifters to accommodate pre-existing high voltage devices.

FIG. 1A shows a multi-voltage circuit arrangement according to the prior art. In particular, FIG. 1A schematically illustrates a hybrid multi-chip circuit system 10, including a semiconductor chip 12 and peripheral devices such as external low voltage devices 14, a power supply 15, a level shifter 16 and external high voltage devices 18. The semiconductor chip 12 is a low voltage device in the sense that it is powered by a semiconductor chip power supply having a voltage level lower than the power supply voltage level of some of the peripheral devices to which the semiconductor chip 12 is connected. Currently, many peripheral devices are preferably powered at either 5 volts or 3.3 volts DC. An example of a high voltage device 18 would accordingly be a device which relies upon a 5 volt power supply, while a low voltage device would be a device which is powered by a 3.3 volt power supply. A range of low voltage devices 14a–14c are shown in FIG. 1A. These devices include a low voltage central processing unit (CPU) 14a, a low voltage memory 14b and a generic low voltage device 14c. Similarly, FIG. 1A shows a plurality of different kinds of high voltage input/output devices 18, respectively 18a and 18b. A power supply 15 provides high voltage (HV) power and low voltage (LV) power to a level shifter 16, and low voltage power to the semiconductor chip 12.

In the case of the prior art multi-chip circuit system 10 shown in FIG. 1A, the low voltage devices 14 are directly connected to a semiconductor chip 12 through a suitable bus 19a, and the high voltage devices 18 are directly connected to the level shifter 16, which in turn is connected to the semiconductor chip 12. The level shifter 16 is a well-known interface device which is effective for receiving output signals from the semiconductor chip 12 and conveying these signals to the high voltage devices 18. The level shifter 16 is further effective for receiving input signals from high voltage devices 18 to be conveyed to the semiconductor chip 12. The level shifter 16 is connected to the high voltage devices 18 along a bus 19b. Busses 19a and 19b can connect one or more devices to the semiconductor chip 12. A bus can further be a serial or parallel electrical connection having a plurality of electric lines.

The semiconductor chip 12 in the prior art of FIG. 1A includes a region of low voltage input/output circuitry 20 and a region of low voltage core circuitry 22 connected to the low voltage input/output circuitry 20. The low voltage core circuitry 22 includes, for example, logic circuitry and memory circuitry for performing a variety of selected operations with respect to a range of external devices and systems. The low voltage input/output circuitry 20 includes input buffers 20a and output buffers 20b. The semiconductor chip 12 is completely unitary in that all of its regions are powered by the same voltage supply level, which is low compared to a high voltage level being employed to power a selected one or more of high voltage devices 18.

FIG. 1B shows another version of the prior art, according to which the level shifters 16 are integrated into the semiconductor chip 12, as opposed to being off chip as shown in FIG. 1A. According to this version of the prior art, a level shifter 16b serves to convert the low voltage output of the low voltage core circuitry 22 to a sufficiently high voltage to drive the high voltage devices 18a and 18b. Conversely, the level shifter 16a converts the high voltage output of the high voltage devices 18a and 18b to the low voltage level required by the low voltage core circuitry 22. With the exception of the level shifters 16a and 16b, the semiconductor chip 12 is supplied with low voltage power (LV) from the power supply 15. The level shifters 16a and 16b are provided with both low voltage power (LV) and high voltage power (HV).

Unfortunately, the use of the level shifters 16a and 16b, whether integrated into the semiconductor chip 12 or used as a separate, discrete element external to the semiconductor chip 12, tends to increase costs significantly. In the case of the external level shifter 16 of FIG. 1A, the increased cost includes the cost of the additional component, a reduction in reliability as a result of an additional connection which may fail and added expense in terms of an opportunity cost since available space is consumed which might effectively have been employed in a more worthwhile fashion. In the case of the on-chip level shifters 16a and 16b of FIG. 1B, the same loss of space detriment is suffered, except that the space relates to available chip topography, rather than real estate consumed on a chip carrier or circuit board. An additional cost is the design cost in customizing the semiconductor chip 12 to include the level shifters 16a and 16b as part of the internal circuitry of the semiconductor chip 12.

It is therefore desirable to have a high voltage semiconductor device which is comparable to the low voltage devices, such as the semiconductor chip 12 of the prior art of FIGS. 1A and 1B, in terms of power conservation, while at the same time obviating the need for the level shifters 16. Such high voltage semiconductor devices would also have speed advantages over the low voltage devices, being operable at a higher voltage. The present invention takes advantage of the fact that the most power hungry logic is the input/output (I/O) circuitry, and achieves the desired multiple goals of having comparable power conservation, avoiding the use of level shifters and attaining higher operating speeds.

SUMMARY OF THE INVENTION

According to the invention, the core circuitry of a semiconductor chip is driven by a power supply voltage equal to the drive voltage of a high voltage input/output device. Typical core circuitry includes logic circuits and memory circuits. Input and output buffers on the semiconductor chip provide an interface to external devices for data communication with the core circuitry. The buffers are supplied with high and low voltage levels to allow for connection to both high and low voltage level external devices, without the need for expensive and space consuming level shifters. In particular, the invention is directed toward a multi-voltage circuit arrangement which is effective for driving input/output circuit devices relying upon a range of power supply voltage levels, obviating the need for level shifter circuitry. The semiconductor chip core circuitry is driven at a high voltage level, and first and second regions of input/output circuitry are established on the semiconductor chip; the first region being configurable for interfacing with high voltage devices, and the second region being configurable for interfacing with low voltage devices.

The invention is further directed toward a multi-voltage circuit on a semiconductor chip including core circuitry driven by a power supply voltage having a high voltage level. The multi-voltage circuit further includes input/output circuitry arranged in groups for operation with external devices having the same operating voltage. Peripheral input/output circuit regions are established on the semiconductor chip to accommodate these groupings of I/O circuitry. These input/output regions allow a systems designer to configure the multi-voltage circuit to interface with any combination of high and low voltage external devices.

According to one version of the invention, the input/output circuitry directed toward interfacing with external devices operating at a particular voltage level is concentrated at a particular selected peripheral region in the perimeter of the semiconductor chip. According to another version of the invention, multiple regions of input/output circuitry are established to cooperate with external devices at a particular voltage level of the same magnitude. These configurable input/output regions provide flexibility for the system designer to assist, for example, in the design of printed circuit board layouts.

According to the invention, the core circuitry is maintained at a relatively high supply voltage with respect to at least some of the input/output circuitry regions. This ensures that there will be no performance degradation due to under voltage operation. Moreover, since power consumption at high voltage is felt primarily in the input/output circuitry regions, operating the core circuitry at a high voltage will not significantly increase power consumption.

BEST MODE FOR CARRYING OUT THE INVENTION

Figure 2:
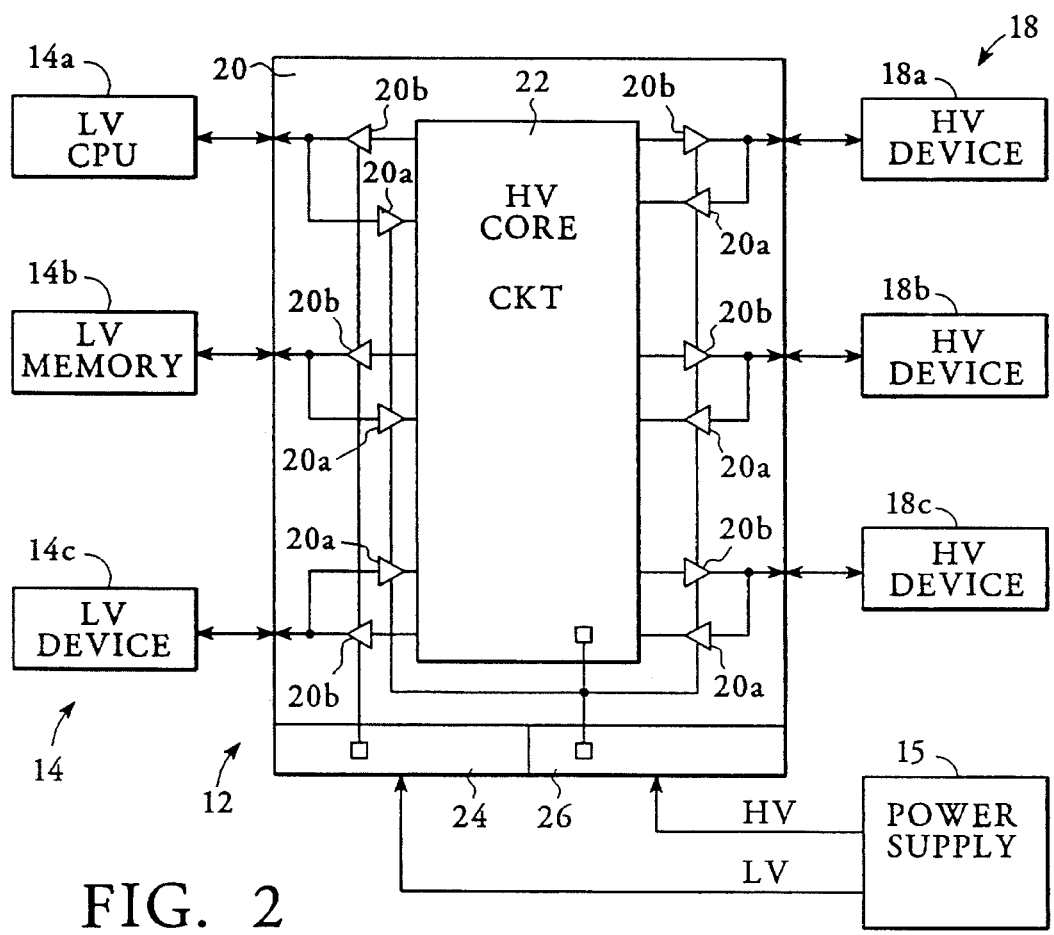
FIG. 2 shows a multi-voltage circuit arrangement according to the invention.

FIG. 2 shows a multi-voltage circuit arrangement fabricated on a single semiconductor chip 12 according to the invention herein. The multi-voltage circuit arrangement includes a core circuitry 22 effective for performing a range of functions and operations, including logic and memory functions. A plurality of input/output (I/O) circuitry 20 provides interfaces for data communication between the core circuitry 22 and various external devices 14a–14c and 18a–18c. The I/O circuitry 20 includes input buffers 20a and output buffers 20b. Power connection points 24 and 26 provide power connections to a power source 15 which provides respectively a low voltage level (LV) and a high voltage level (HV). In accordance with the invention, the core circuitry 22 is electrically connected to the high voltage connection point 26 for high voltage operation.

Typical voltage values currently used in the industry include devices which operate at a high voltage value of 5 volts and devices which operate at a low voltage value of 3.3 volts. However, the 5 volt and 3.3 volt values are not a requirement of the multi-voltage device made in accordance with the invention. The high and low voltage values actually used may be based upon the voltage levels of the external devices present in a particular application, and are not necessarily fixed to the standards set by the industry. For example, custom designed external devices which have operating voltages different from the industry standards may be used with the multi-voltage device 12 of FIG. 2. The standard 5 volt and 3.3 volt voltage levels may not be appropriate in such an application. In general, by selecting the appropriate device geometries, a multi-voltage device in accordance with the invention can be manufactured to operate with different pairs of high voltage and low voltage values.

FIG. 2 also shows that all of the input buffers 20a are connected to the high voltage power connection point 26. The resulting high operating voltage of the input buffers 20a are thus able to drive the high voltage core circuitry 22 regardless of whether the external device is a high voltage device 18a–18c or a low voltage device 14a–14c, thus effectuating the communication of data from the external devices to the high voltage core circuitry 22. It is noted that the input buffers 20a need not be coupled to the same power connection point, so long as the input buffers 20a are coupled to a power source that provides the same voltage level needed to drive the core circuitry 22.

Specifications for external devices presently include, but are not limited to, high voltage devices which have an output voltage swing from 0–5 volts and low voltage devices which have an output voltage swing from 0–3.3 volts. In addition, the industry has come to recognize the TTL compatible model for digital circuits, which defines a logical zero by a voltage level of <0.8 volts and a logical one by a voltage level of >2.0 volts. Thus, if the multi-voltage device 12 of FIG. 2 is supplied with power for operation with high voltage devices operating at a voltage level of 5 volts and low voltage devices operating at a voltage level of 3.3 volts, the input buffers 20a are said to be TTL compatible since the output voltage swing of each type of device conforms to TTL voltage level definitions.

FIG. 2 further shows that some of the output buffers 20b are connected to the high voltage power connection point 26. The resulting high operating voltage of these output buffers 20b is capable of driving the high voltage devices 18a–18c to which they are connected, thereby allowing for the communication of data from the high voltage core circuitry 22 to the high voltage devices 18a–18c. In like fashion, the remainder of the output buffers 20b are connected to the low voltage power connection point 24. The low voltage supplied to these output buffers 20b limits their output voltage swing between ground and the value of the low voltage supplied, despite the fact that the output buffers 20b are driven by high voltage signals from the high voltage core circuitry 22. The proper electrical signals are thereby presented to the external low voltage devices 14a–14c, allowing for the communication of data from the high voltage core circuitry 22 to the low voltage external devices 14a–14c. It is not required that the output buffers 20b be coupled to the connection points 24 and 26 as shown in FIG. 2. It is sufficient that the output buffers 20b be provided with power at the voltage levels that correspond to the voltage levels of the devices to which the output buffers would be connected.

Figure 1A:
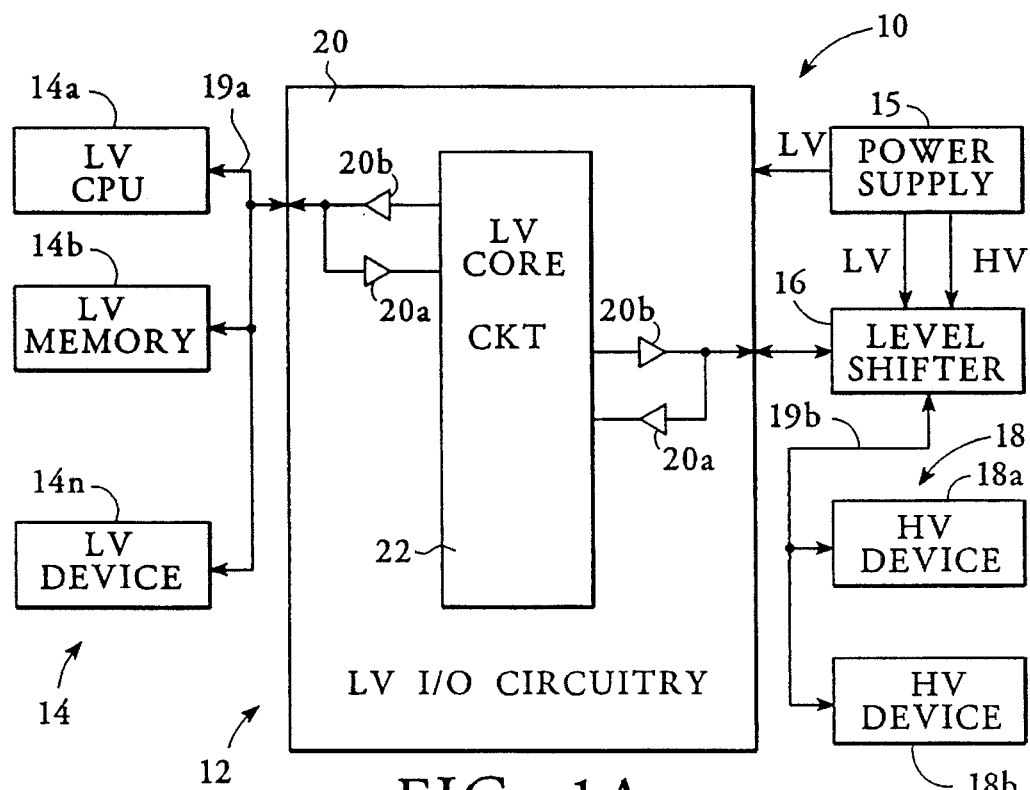
FIG. 1A shows a multi-voltage circuit arrangement according to the prior art in which high voltage and low voltage devices can be operated in connection with a semiconductor chip relying upon lower voltage core circuitry, including level shifter circuitry external to the semiconductor chip.
Figure 1B:
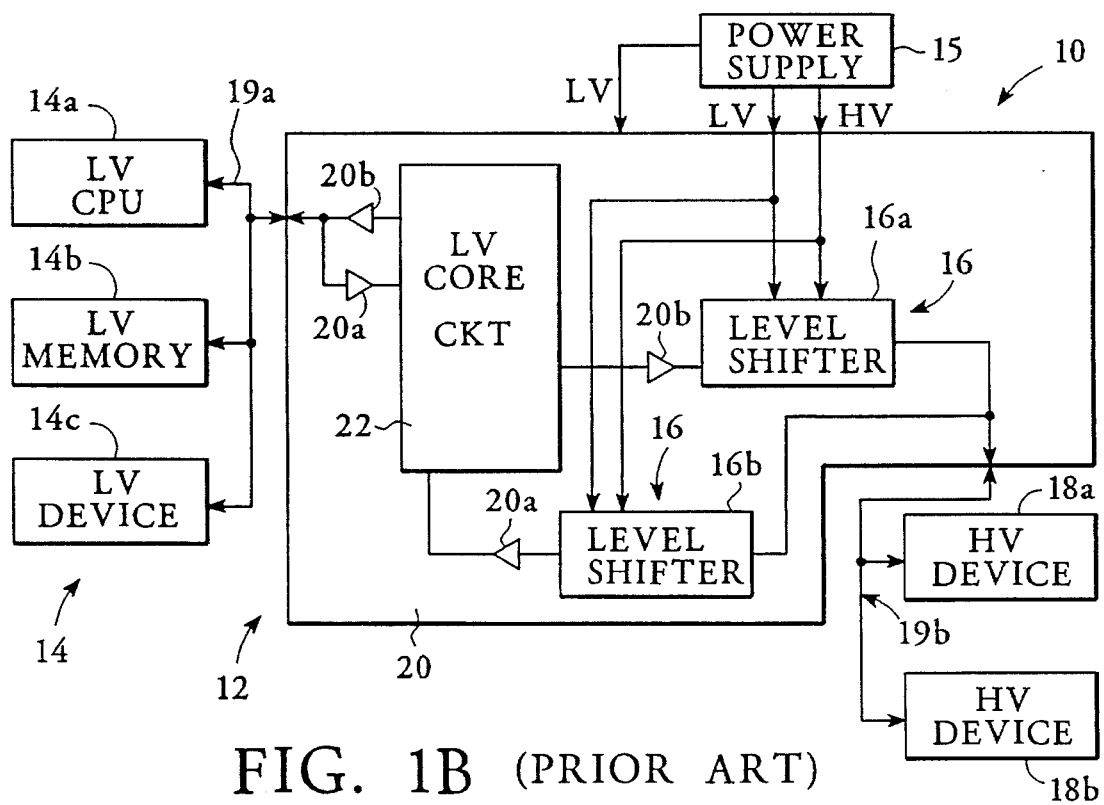
FIG. 1B shows a multi-voltage circuit arrangement according to the prior art in which high voltage and low voltage devices can be operated in connection with a semiconductor chip relying upon low voltage core circuitry, including level shifter circuitry integrated into the semiconductor chip.

The advantage of the multi-voltage circuit of FIG. 2 is made clear by referring back to the prior art of FIGS. 1A and 1B. The low voltage I/O circuitry 20 of the prior art circuits cannot drive the high voltage devices 18 without the aid of a level shifter 16. Furthermore, the core circuitry 22 of the prior art operates at a slower speed due to its low operating voltage. By comparison, the arrangement of the input and output buffers 20a and 20b of the circuit of FIG. 2 as described above obviates the level shifters of the prior art, while at the same time allowing for the core circuitry 22 to operate at a high voltage level to attain the preferred higher operating speed.

Figure 3:
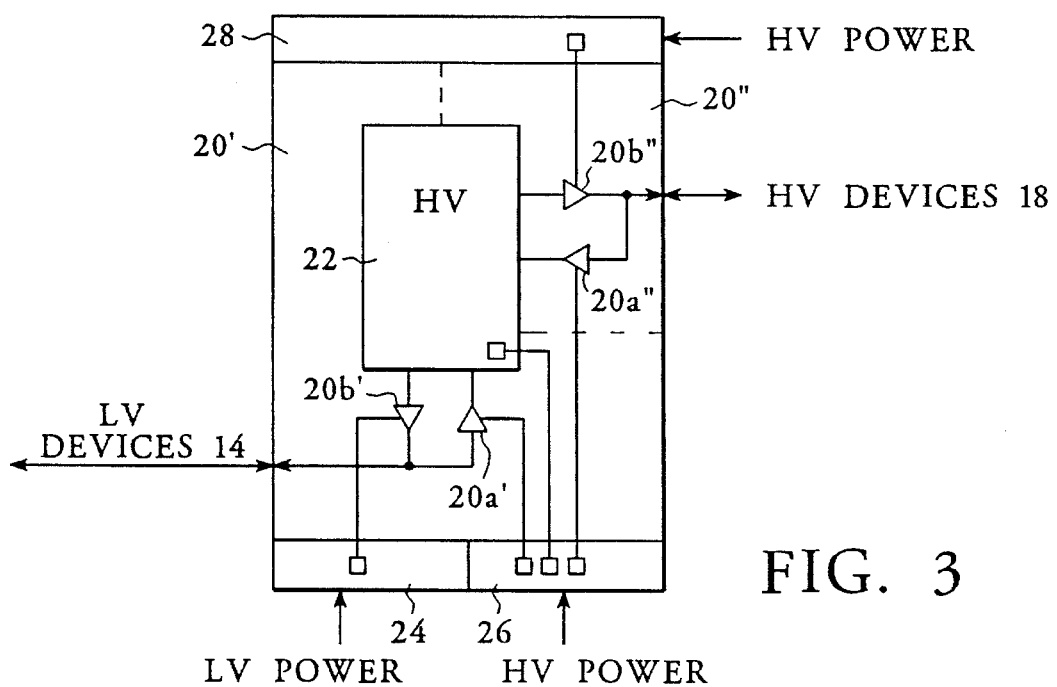
FIG. 3 depicts a multi-voltage semiconductor according to the invention, including first and second groups of input/output circuitry configured to operate at a high voltage level and a low voltage level.

FIG. 3 illustrates an arrangement of input/output circuit elements into regions according to the invention herein, which is effective for permitting direct operation with both high voltage and low voltage external input/output devices 18 and 14. This is accomplished by operating a core circuitry 22 at a selected high voltage level approximately the same as the operating voltage of the highest voltage external input/output device, and providing a plurality of different regions of input/output circuitry 20. This is illustrated in FIG. 3 by an annular region of input/output circuitry disposed about the periphery, or perimeter, of the core circuitry 22. Each of the input/output regions 20' and 20" includes one or more pairs of input and output buffers. FIG. 3 illustrates a pair of input/output buffers 20a'/20b' and 20a"/20b" for each input/output region 20' and 20" respectively.

Three power connection points 24, 26 and 28 are shown for providing power to the core circuitry 22, and to the two input/output regions 20' and 20". Thus, the core circuitry 22 is coupled to power connection point 26, to which a high voltage (HV) power source is connected. In accordance with the invention, all of the input buffers 20a' and 20a" of the input/output regions 20' and 20" are powered at the same voltage level as the core circuitry 22, as exemplified in FIG. 3 by the electrical connections to power connection point 26. Further in accordance with the invention, all of the output buffers 20b' of the input/output region 20' are coupled to power connection point 24, and all of the output buffers 20b" of the input/output region 20" are coupled to power connection point 28. It is noted that the input buffers 20a' and 20a" and the core circuitry 22 need not be coupled to the same power connection point 26. A power coupling which provides the same voltage level to the input buffers 20a' and 20a" as the core circuitry 22 is within the spirit and scope of the invention.

FIG. 3 shows a particular configuration of the invention in which the input/output region 20' is configured for interfacing with low voltage devices 14, as indicated by the connection of a low voltage (LV) power source to the power connection point 24. The input/output region 20" is shown configured for interfacing with high voltage devices 18, as evidenced by the connection of an HV power source to the power connection point 28. The high operating voltage of the input buffers 20a' and 20a" are able to drive the core circuitry 22 to allow the communication of data to the core circuitry 22 from any external device, whether the operating voltage of the device is a high voltage or a low voltage level. Conversely, the separately powered output buffers 20b' and 20b" of each input/output region 20' and 20" provide proper electrical interfaces to the corresponding high and low voltage external devices 14 and 18 for communication of data from the core circuitry 22. In particular, the low operating voltage of the output buffers 20b' limits their output voltage swing, despite the high voltage signals of the high voltage core circuitry 22, and thus provides the proper signal levels to the low voltage devices 14. This multi-voltage arrangement obviates the need for the level shifters 16 (FIGS. 1A and 1B) of the prior art.

While FIG. 3 shows only two regions of input/output circuitry 20' and 20", it is possible to implement the invention with a greater multiplicity of regions, thus providing increased design flexibility. This is shown with particularity in FIG. 4, which illustrates a voltage topography according to this version of the invention, in which a greater number of regions of input/output circuitry are fabricated on the semiconductor chip 12.

Figure 4:
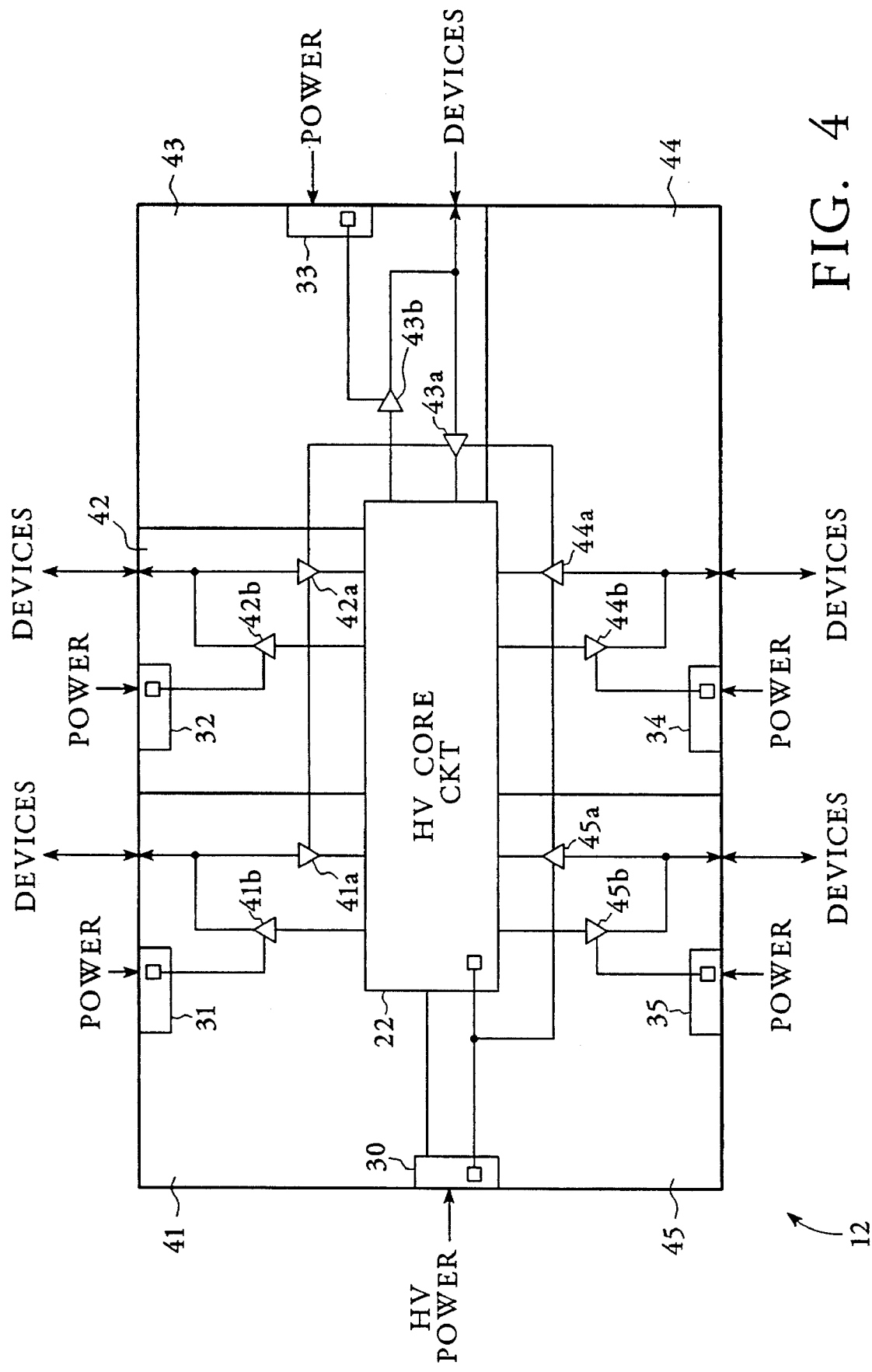
FIG. 4 illustrates a multi-voltage semiconductor of the preferred embodiment having a plurality of I/O regions.

FIG. 4 shows an embodiment of the multi-voltage semiconductor device 12 in accordance with the disclosed invention which offers greater design flexibility for a system designer. A core of high voltage core circuitry 22 is fabricated on the multi-voltage device 12. A power connection point 30, to which a high voltage power source is connected, couples a high voltage level to the core circuitry 22 for high voltage operation. Defined along the periphery of the core circuitry 22 are a number of regions 41–45 in which input/output circuitry is disposed 41a/41b–45a/45b. Each region 41–45 further includes a corresponding power connection point 31–35 respectively.

At least one pair of input and output buffers 41a/41b–45a/45b is disposed in each of the regions 41–45. Moreover, the input buffers 41a–45a of all of the regions 41–45 are powered at the same voltage level as the voltage level used to power the core circuitry 22. Thus, for example, FIG. 4 illustrates electrical coupling of the input buffers 41a–45a to the power connection point 30, to which the core circuitry 22 is also coupled. By comparison, the output buffers 41b–45b are connected to separate power connection points 31–35 respectively.

With the multi-voltage device as described in FIG. 4, any external device can communicate data to the core circuitry 22 because the input buffers 41a–45a operate at the same voltage level as the core circuitry and therefore are able to drive the core circuitry, regardless of the operating voltage of the external device. Furthermore, by connecting the appropriate voltage level to each power connection point 31–35 of each region 41–45, any combination of high voltage and low voltage external devices can receive data from the core circuitry 22.

The multi-voltage device 12 of FIG. 4 shows POWER signals coupled to each of the power connection points 31–35. By selecting appropriate voltage levels for each POWER signal, any combination of high voltage and low voltage DEVICES can be interfaced to the core circuitry 22 for data communication. For example, selecting low voltage POWER signals for the power connection points 31, 33 and 35, and high voltage POWER signals for the power connection points 32 and 34 will result in an alternating arrangement of low and high power input/output regions 41–45. Similarly, it is possible to select appropriate POWER signal voltage levels so that adjacent regions have the same operating voltage level. Thus, selecting high voltage POWER signals for the power connection points 31, 32 and 33, and low voltage POWER signals for the power connection points 34 and 35 will result in adjacent regions of operating voltage. The configuration of high and low input/output regions will depend upon the system requirements of the particular hardware application. Furthermore, the device of FIG. 4 is not limited to five distinct input/output regions. It is contemplated that devices in accordance with the invention may have fewer or more distinct input/output regions.

The description above details preferred versions of the invention. It is noted that the present invention is not limited to the specific embodiments described in the specification, and that a person of ordinary skill in the art of semiconductor device manufacture will contemplate additional embodiments consistent with the spirit and scope of the invention. The invention described herein is stated completely in the claims which follow.

We claim:

1. A multi-voltage circuit on a single semiconductor chip, comprising:

a first input of electrical power having a first voltage level;

a second input of electrical power having a second voltage level less than said first voltage level;

core circuitry having an electrical connection to said first input, thereby operating at said first voltage level;

first I/O circuitry in data communication with said core circuitry, said first I/O circuitry having a first data path to an external device being powered at said first voltage level; and second I/O circuitry in data communication with said core circuitry, said second I/O circuitry having a second data path to an external device being powered at said second voltage level, said second I/O circuitry including at least one input buffer having an electrical connection to said first input, said second I/O circuitry including an output buffer corresponding to said input buffer and having an electrical connection to a second input.

2. The multi-voltage circuit according to claim 1, wherein said first I/O circuitry includes at least one input buffer and a corresponding output buffer, both of said buffers being connected to said first input.

3. The multi-voltage circuit according to claim 2, wherein said input buffers of said first and second I/O circuitry are TTL compatible.

4. The multi-voltage circuit according to claim 1, wherein said first input is an input of electrical power at a voltage level of 5 volts.

5. The multi-voltage circuit according to claim 1, wherein said second input is an input of electrical power at a voltage level of 3.3 volts.

6. The multi-voltage circuit according to claim 1, wherein said first and second I/O circuitry are respectively fabricated in first and second regions of a perimeter of a semiconductor chip.

7. A multi-voltage semiconductor chip, comprising:

core circuitry having an operating voltage equal to a first voltage level;

first and second groups of input and output buffer circuits, said first and second groups of input and output buffers coupled to said core circuitry to provide data access between said core circuitry and external devices, each of said input buffers of said first and second groups having an operating voltage equal to said first voltage level;

first connection means for supplying power, said output buffers of said first group having a power attachment to said first connection means; and second connection means for supplying power, said output buffers of said second group having a power attachment to said second connection means;

said output buffers of said first and second groups being operable at said first voltage level and at a second voltage level, respectively, said second voltage level being less than said first voltage level;

said first and second connection means for supplying power each capable of being user-selectably coupled to one of a first power supply and a second power supply, said second power supply being operative at said second voltage level.

8. The multi-voltage semiconductor chip of claim 7, further including at least a third group of input and output buffers coupled to said core circuitry to provide data access between said core circuitry and external devices, said input buffers of said third group having an operating voltage equal to said first voltage level, each of said output buffers of said third group capable of being user-selectably coupled to one of said first and second power supplies.

9. The multi-voltage semiconductor chip of claim 7, wherein said core circuitry is effective for performing logic functions.

10. The multi-voltage semiconductor chip of claim 7, wherein said core circuitry is effective for performing memory functions.

11. The multi-voltage semiconductor chip of claim 7, wherein said first voltage level is substantially equal to 5 volts, and said second voltage level is substantially equal to 3.3 volts.

12. A method of fabricating a multi-voltage semiconductor chip, comprising the steps of:

selecting a high voltage level and a low voltage level so that the value of said high voltage level is greater than the value of said low voltage level;

fabricating a core of electronic circuitry to operate at said high voltage level;

selecting a plurality of regions along the periphery of said core of electronic circuitry; and disposing a group of I/O circuitry in each of said plurality of regions;

said step of disposing including the steps of forming input buffers in each of said plurality of regions and providing power to all of said input buffers to operate at said high voltage level;

said step of disposing including the steps of forming output buffers in each of said plurality of regions, forming a power connection point in each of said plurality of regions and for each of said plurality of regions coupling each of said output buffers within said region to the power connection point corresponding to said region.

13. The method of fabricating a multi-voltage chip of claim 12, wherein said step of selecting a high voltage value includes selecting a voltage value substantially equal to 5 volts, and said step of selecting a low voltage value includes selecting a voltage value substantially equal to 3.3 volts.

14. The method of fabricating a multi-voltage chip of claim 12, wherein said step of fabricating said core of electronic circuitry includes forming a core power connection point, coupling said core of electronic circuitry to said core power connection point and connecting said core power connection point to a power source providing a voltage equal to said first voltage level.

* * * * *